United States Patent
Zhong et al.

(10) Patent No.: US 11,254,099 B2
(45) Date of Patent: Feb. 22, 2022

(54) GASIFICATION COMPONENT COATED WITH CHROMIUM COATING AND METHOD FOR PROTECTING GASIFICATION COMPONENT BY USING CHROMIUM COATING

(71) Applicant: Air Products and Chemicals, Inc., Allentown, PA (US)

(72) Inventors: Dalong Zhong, Pudong (CN); Lawrence Bernard Kool, Clifton Park, NY (US); Boon Hing Tan, Singapore (SG)

(73) Assignee: Air Products & Chemicals, Inc., Allentown, PA (US)

( * ) Notice: Subject to any disclaimer, the term of this patent is extended or adjusted under 35 U.S.C. 154(b) by 455 days.

(21) Appl. No.: 15/616,352

(22) Filed: Jun. 7, 2017

(65) Prior Publication Data
US 2017/0368796 A1 Dec. 28, 2017

(30) Foreign Application Priority Data
Jun. 23, 2016 (CN) .......................... 201610462964.7

(51) Int. Cl.
| | | |
|---|---|---|
| *B32B 15/01* | (2006.01) | |
| *C23C 16/10* | (2006.01) | |
| *C10J 3/74* | (2006.01) | |
| *B22F 1/00* | (2006.01) | |
| *B22F 7/08* | (2006.01) | |

(Continued)

(52) U.S. Cl.
CPC .......... *B32B 15/017* (2013.01); *B22F 1/0059* (2013.01); *B22F 7/08* (2013.01); *C10J 3/72* (2013.01); *C10J 3/74* (2013.01); *C23C 16/0281* (2013.01); *C23C 16/042* (2013.01); *C23C 16/06* (2013.01); *C23C 16/10* (2013.01); *B22F 1/007* (2013.01); *B32B 2255/06* (2013.01);

(Continued)

(58) Field of Classification Search
None
See application file for complete search history.

(56) References Cited

U.S. PATENT DOCUMENTS 6,284,324 B1 * 9/2001 Whittaker ................. C23C 4/06
427/452
6,755,355 B2 6/2004 Whittaker
(Continued)

FOREIGN PATENT DOCUMENTS

| CN | 101280409 A | 10/2008 |
|---|---|---|
| CN | 101709229 A | 5/2010 |
| CN | 102492479 A | 6/2012 |

OTHER PUBLICATIONS

"How Car Cooling Systems Work" (https://auto.howstuffworks.com/cooling-system5.htm via Internet Wayback Machine https://web.archive.org/web/20150423070121/https://auto.howstuffworks.com/cooling-system5.htm, Apr. 23, 2015) (Year: 2015).*

(Continued)

*Primary Examiner* — Laura C Powers
(74) *Attorney, Agent, or Firm* — Jason M. Ploeger

(57) ABSTRACT

A gasification component for use in a gasification environment includes a metal-based substrate and a coating deposited on the metal-based substrate. The coating includes at least about 51% by weight of chromium in the alpha phase at an operating temperature of gasification.

13 Claims, 5 Drawing Sheets

(51) Int. Cl.
*C10J 3/72* (2006.01)
*C23C 16/02* (2006.01)
*C23C 16/04* (2006.01)
*C23C 16/06* (2006.01)

(52) U.S. Cl.
CPC ......... *B32B 2255/205* (2013.01); *Y02E 20/16* (2013.01); *Y02E 20/18* (2013.01)

(56) References Cited

U.S. PATENT DOCUMENTS

| | | | |
|---|---|---|---|
| 6,892,654 B2 | 5/2005 | Whittaker et al. | |
| 7,364,801 B1* | 4/2008 | Hazel | C22C 1/023 |
| | | | 416/229 R |
| 8,262,812 B2 | 9/2012 | Helmick et al. | |
| 8,273,416 B2 | 9/2012 | Helmick et al. | |
| 2007/0116884 A1 | 5/2007 | Pareek et al. | |
| 2008/0245446 A1* | 10/2008 | Quadakkers | C23C 2/26 |
| | | | 148/286 |
| 2010/0101203 A1 | 4/2010 | Harned et al. | |
| 2011/0058952 A1* | 3/2011 | Pillhoefer | C23C 10/10 |
| | | | 416/241 R |
| 2011/0254230 A1* | 10/2011 | Jarosinski | C22C 27/06 |
| | | | 277/444 |
| 2011/0318601 A1* | 12/2011 | Helmick | C23C 10/26 |
| | | | 428/610 |
| 2015/0345782 A1* | 12/2015 | Kishore | F23D 1/00 |
| | | | 431/160 |
| 2016/0184890 A1* | 6/2016 | Kool | B22F 1/007 |
| | | | 428/553 |

OTHER PUBLICATIONS

H Singh et al., "Use of plasma spray technology for deposition of high temperature oxidation/corrosion resistant coatings", Materials and Corrosion, vol. 58, Issue: 2, pp. 92-102, Feb. 2007.
Chinese Office Action for related Chinese application No. 201610462964.7 dated Sep. 29, 2019.

* cited by examiner

GASIFICATION COMPONENT COATED WITH CHROMIUM COATING AND METHOD FOR PROTECTING GASIFICATION COMPONENT BY USING CHROMIUM COATING

BACKGROUND

The present disclosure generally relates to gasification components coated with a protective coating and methods for protecting gasification components from harsh gasification environments by using the protective coating.

Gasification is a process that converts a carbonaceous material such as coal or biomass into a synthesis gas mixture (syngas) essentially including carbon monoxide and hydrogen, which is widely used as a source of hydrogen for hydrogenation reactions and as a source of feed gas for the synthesis of hydrocarbons and other compounds. Gasification is a complex process, during which the carbonaceous material is reacted with a controlled amount of oxygen and/or steam in a combustion chamber at a temperature in a range of about 700° C. to about 2500° C. and at a pressure in a range of about 1 to about 300 atmospheres to produce the syngas. As the carbonaceous material usually contains various contaminants such as sulfur, the partial combustion of the carbonaceous material with oxygen causes an extremely harsh environment. The harsh environment significantly limits the life and reliability of gasification components exposed to the combustion chamber. For example, as for a feed injector nozzle or burner for use in the gasification apparatus for producing the syngas, which are often formed of an iron, nickel, or cobalt-base superalloy, abrasive wear, heavy corrosion, and/or thermal fatigue cracking may occur at the surface or area subjected to the harsh environment.

Therefore, gasification components often require environmentally protective coatings on the surfaces exposed to the gasification environment due to the severity of their operating environments. Many attempts have been made in the past, with varying levels of success, to provide protective coatings on the surfaces exposed to the gasification environment. For example, different coatings may be applied to a surface of an injector nozzle which is exposed to the gasification environment for different purposes, for example, for preventing corrosion and/or resist high temperature. However, some coatings have good resistances to corrosion by reducing gases but are not so resistant to high temperature oxidation, whereas some other coatings have good resistances to high temperature oxidation but are not so resistant to corrosion by reducing gases.

Therefore, it is desirable to provide a new coating that obviates or mitigates the shortcomings of the prior art and successfully protects gasification components from harsh gasification environments.

BRIEF DESCRIPTION

In one aspect, a gasification component for use in a gasification environment includes a metal-based substrate and a coating deposited on the metal-based substrate. The coating includes at least about 51% by weight of chromium in the alpha phase at an operating temperature of gasification.

In another aspect, a method for protecting a gasification component from a gasification environment includes coating a surface of the gasification component with a coating comprising at least about 51% by weight of chromium in the alpha phase at an operating temperature of gasification, and using the gasification component in gasification with the coating exposed to the gasification environment.

BRIEF DESCRIPTION OF THE DRAWINGS

The above and other aspects, features, and advantages of the present disclosure will become more apparent in light of the subsequent detailed description when taken in conjunction with the accompanying drawings in which.

DETAILED DESCRIPTION

Figure 1:
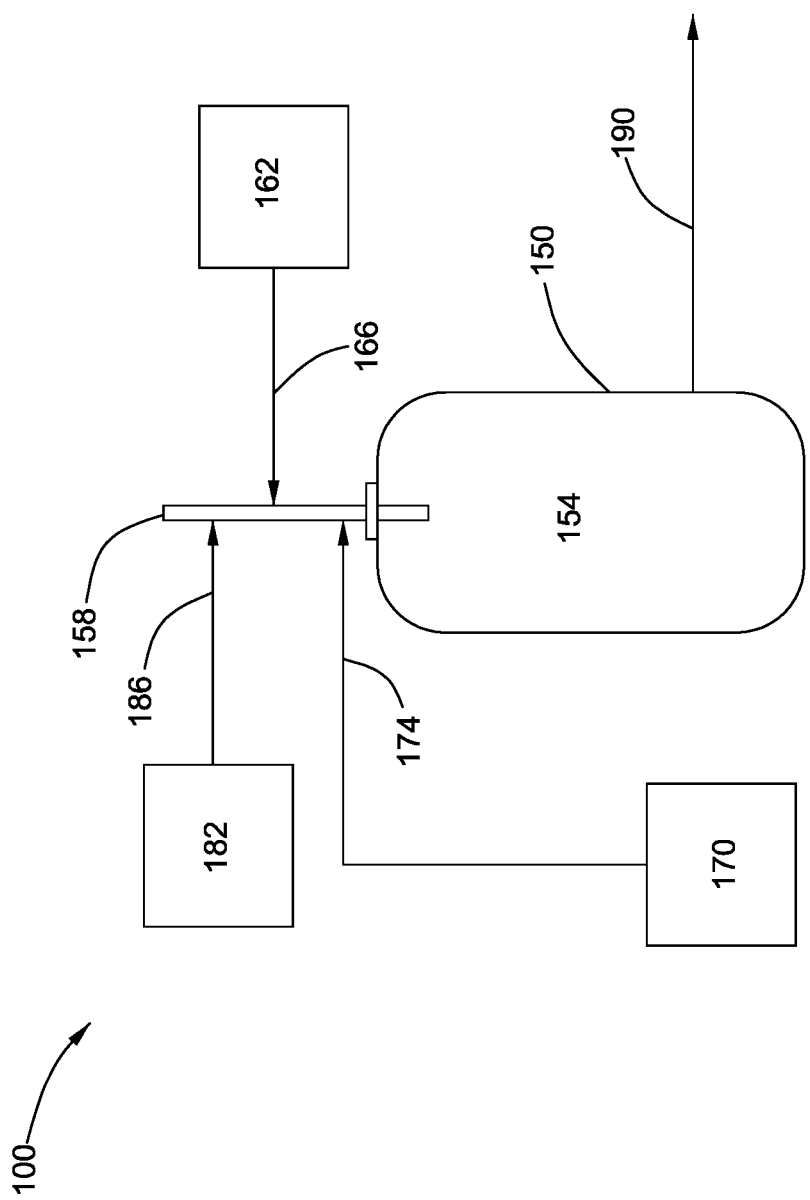
FIG. 1 is a schematic diagram of portions of a gasification system.

Embodiments of the present disclosure will be described below. Unless defined otherwise, technical and scientific terms used herein have the same meaning as is commonly understood by one of skill in the art to which this invention belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean any, some, or all of the listed items. The use of "including," "comprising" or "having" and variations thereof herein are meant to encompass the items listed thereafter and equivalents thereof as well as additional items.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. Additionally, when using an expression of "about a first value—a second value," the about is intended to modify both values. In at least some instances, the approximating language may correspond to the precision of an instrument for measuring the value. Here, and throughout the specification and claims, range limitations may be combined and/or interchanged, such ranges are identified and include all the sub-ranges contained therein unless context or language indicates otherwise.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Embodiments of the present disclosure relate to protective coating systems suitable for components exposed to a harsh gasification environment, as well as gasification components coated with the protective coating. The coating includes chromium in the alpha phase, and it has good resistances to both high temperature oxidation and corrosion by reducing gases and is capable of effectively protecting a metal substrate therebelow from the harsh gasification environment. The coating prolongs the life of the gasification component by blocking the passage of corrosive species that cause the failure of the gasification component, and thus the gasification component protected by the coating has a prolonged service life.

As used herein, the term "gasification environment" refers to an environment where gasification of a carbonaceous material such as coal occurs, at a temperature in a range of about 700° C. to about 2500° C., and particularly in a range of about 1200° C. to about 1800° C., and at a pressure in a range of about 1 to about 300 atmospheres, and particularly in a range of about 10 to about 100 atmospheres. In some embodiments, the carbonaceous material includes coal, and in some particular embodiments, the carbonaceous material includes sulfur-containing coal. In some embodiments, partial combustion of the carbonaceous material with oxygen during the gasification may cause an extremely harsh gasification environment including a complex gas mixture (containing oxygen, hydrogen, carbon monoxide, carbon dioxide, hydrogen sulfide, and etc.).

The coating is particularly applicable to feed injectors for use in coal gasification apparatus, and therefore embodiments hereinafter will be described in detail by taking such a feed injector as an example of the gasification component. But it should be understood that gasification components as described herein are not limited to feed injectors, and the coating as described herein is also applicable to gasification components other than feed injectors. The "gasification component" may be any metal-based components having at least one surface exposed to the gasification environment.

FIG. 1 shows a schematic diagram of portions of a gasification system 100. The gasification system 100 may include a gasifier 150 configured to receive a mixture of fuel, air/oxygen, steam, and possibly other materials to produce syngas within a reaction zone 154 defined therein. The gasification system 100 also may include a feed injector 158 configured to atomize and mix the fuel, air/oxygen, steam, and other possible materials, and to deliver the mixture to the reaction zone 154 of the gasifier 150.

As is shown, the feed injector 158 may be in communication with a fuel source 162 for receiving a flow of carbonaceous fuel 166, such as oil, gas, or coal slurry, therefrom. The feed injector 158 also may be in communication with an air/oxygen source, such as an air source 170 for receiving a flow of air 174, therefrom. In some embodiments, the feed injector 158 further may be in communication with a steam source 182 for receiving a flow of steam 186 therefrom. As is shown, a tip portion of the feed injector 158 may extend into the reaction zone 154 to deliver the mixture of the fuel, air/oxygen, steam, and other possible materials thereto.

The gasifier 150 may produce a flow of raw syngas 190 via a partial oxidation process carried out according to one of several known techniques. The flow of raw syngas 190 may be directed to a post-processing system for cleaning and/or using the raw syngas 190. For example, when the gasification system 100 is used in an integrated gasification combined cycle ("IGCC") power plant, the flow of raw syngas 190 may be directed to an acid gas removal system which removes carbon dioxide, hydrogen sulfide and other gases from the raw syngas 190 to produce a flow of clean syngas which may be directed to a combustor of a gas turbine engine. The gasification system 100 may have many other configurations and may include many other types of components for carrying out additional steps in producing and conditioning the flow of clean syngas.

Figure 2:
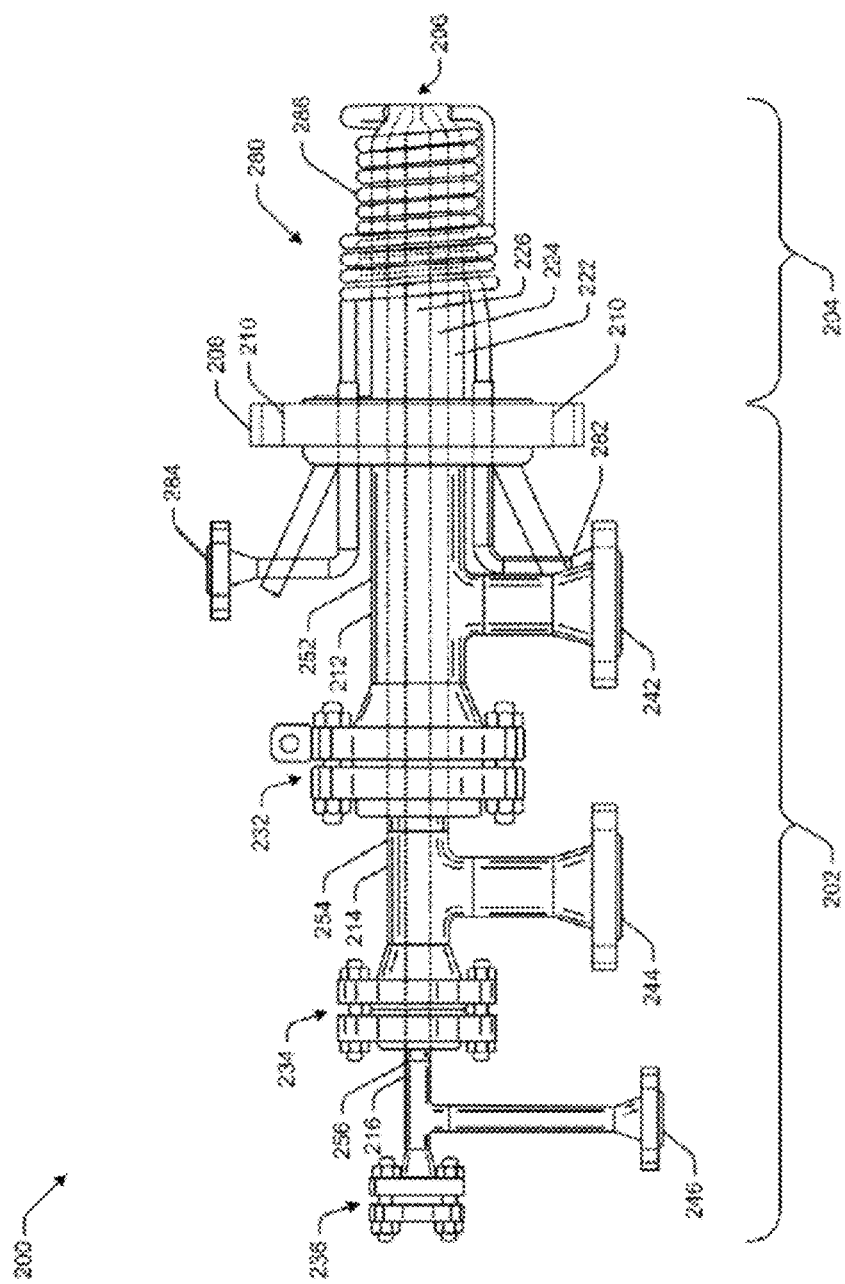
FIG. 2 is a side plan view of a feed injector as may be used in the gasification system of FIG. 1.
Figure 3:
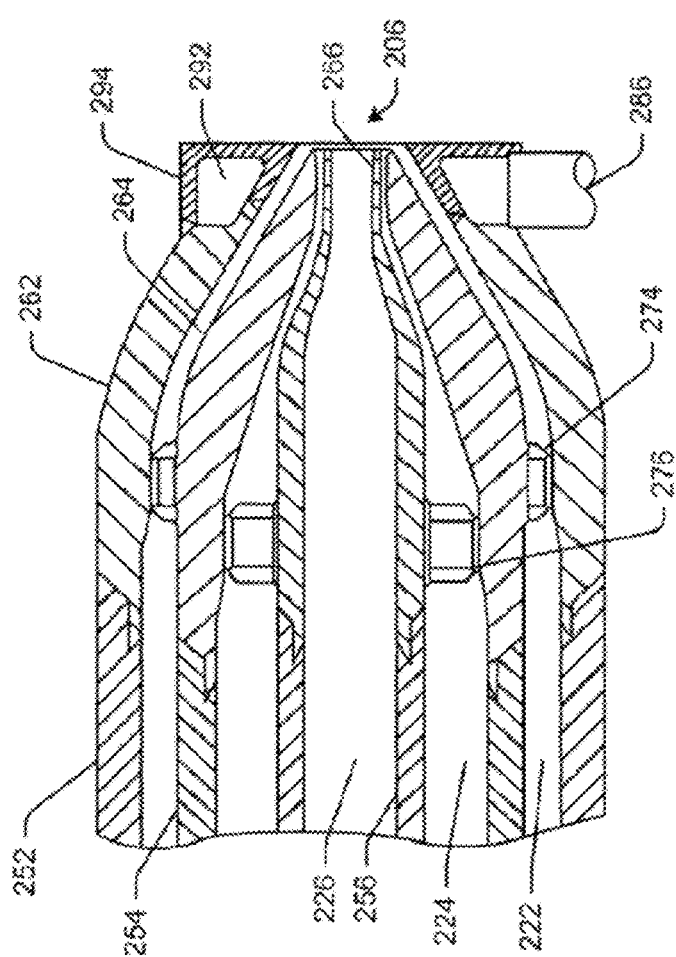
FIG. 3 is a detailed side cross-sectional view of a left section of the feed injector of FIG. 2.

FIGS. 2-3 show an exemplary feed injector 200 as may be used in the gasification system 100. The feed injector 200 may include an upstream portion 202 configured to be positioned outside of the gasifier 150 and to receive the flow of fuel 166, the flow of air 174, and the flow of steam 186 for atomization and mixing. The feed injector 200 also may include a downstream portion 204 configured to be positioned inside of the gasifier 150 and to deliver the mixture of the fuel, air/oxygen, and steam to the reaction zone 154 via a tip end 206. The feed injector 200 further may include a mounting flange 208 configured for mounting the feed injector 200 to the gasifier 150 such that the upstream portion 202 is positioned outside of the gasifier 150 and the downstream portion 204 is positioned inside of the gasifier 150 for operation. The mounting flange 208 may define a number of mounting holes 210 therein for connecting the mounting flange 208 to the gasifier 150 via a number of bolts, screws, or other fasteners.

The feed injector 200 may include a number of tubes arranged in a concentric manner and defining a number of concentric feed passages therethrough. Specifically, the feed injector 200 may include three tubes, an outer tube 212, an intermediate tube 214, and an inner tube 216, which define an outer feed passage 222, an intermediate feed passage 224, and an inner feed passage 226, respectively. As is shown, the outer tube 212 and the outer feed passage 222 may extend from the tip end 206 of the feed injector 200 to an outer tube coupling 232. In a similar manner, the intermediate tube 214 and the intermediate feed passage 224 may extend from the tip end 206 of the feed injector 200 to an intermediate tube coupling 234. Finally, the inner tube 216 and the inner feed passage 226 may extend from the tip end 206 of the feed injector 200 to an inner tube coupling 236. The feed injector 200 may include any number of tubes defining any number of feed passages.

The feed injector 200 further may include an outer tube inlet 242, an intermediate tube inlet 244, and an inner tube inlet 246 attached to the outer tube 212, the intermediate tube 214, and the inner tube 216, respectively, along the upstream portion 202 of the feed injector 200. The outer tube inlet 242 may be configured to direct a first portion of the flow of air 174 into the outer feed passage 222 for passage therethrough and into the gasifier 150. In some embodiments, the outer tube inlet 242 also may be configured to direct a portion of the flow of steam 186 into the outer feed passage 222. The intermediate tube inlet 244 may be configured to direct the flow of fuel 166 into the intermediate feed passage 224 for passage therethrough and into the gasifier 150. In some embodiments, the intermediate tube inlet 244 also may be configured to direct a portion of the flow of steam 186 into the intermediate feed passage 224. The inner tube inlet 246 may be configured to direct a second portion of the flow of air 174 into the inner feed passage 226 for passage therethrough and into the gasifier 150. In some embodiments, the inner tube inlet 246 also may be configured to direct a portion of the flow of steam 186 into the inner feed passage 226.

As is shown, the bayonet-style tubes of the feed injector 200 each may include a pipe portion and a tip portion fastened to one another by welding. Specifically, the outer tube 212 may include an outer tube pipe portion 252 and an outer tube tip portion 262, the intermediate tube 214 may include an intermediate tube pipe portion 254 and an intermediate tube tip portion 264, and the inner tube 216 may include an inner tube pipe portion 256 and an inner tube tip portion 266. In this manner, the tip portions of the tubes may be replaced periodically due to cracking, corrosion, or erosion that may occur as discussed herein above during operation of the feed injector 200. In some embodiments, one or more of the tubes may include one or more centering fins configured to maintain the concentric arrangement of the tubes and the feed passages. For example, the intermediate tube 214 may include intermediate tube centering fins 274 attached to the intermediate tube tip portion 264, and the inner tube 216 may include inner tube centering fins 276 attached to the inner tube tip portion 266. The centering fins may be attached to the respective tip portion, for example, by welding.

The feed injector 200 further may include a water cooling system 280 configured to circulate a flow of cooling water about the downstream portion 204 of the feed injector 200. The water cooling system 280 may include a water cooling inlet 282, a water cooling outlet 284, and a water cooling coil 286. The water cooling coil 286 may be positioned about the outer tube 212 near the tip end 206 of the feed injector 200, as is shown. In this manner, circulation of cooling water through the water cooling coil 286 may facilitate cooling of the tip portions of the tubes, particularly the outer tube tip portion 262, during operation of the feed injector 200. As is shown, the water cooling coil 286 may be attached to a water cooling passage 292 defined in a ring region 294 of the outer tube tip portion 262, for example, by welding.

The different parts of the feed injector 200 may be formed of various metals or metal alloys, including but not limited to metals or alloys including nickel, cobalt or a combination thereof. For example, the mounting flange 208 may be formed of SA182 F11 C12 chromium-molybdenum alloy, the outer tube pipe portion 252 may be formed of INCONEL 625 nickel-chromium alloy, the outer tube tip portion 262 may be formed of HAYNES 188 cobalt-nickel-chromium-tungsten alloy, UMCO 50 cobalt-chromium alloy, or other cobalt-based superalloys or nickel-based superalloys, the intermediate tube tip portion 264 may be formed of HAYNES 188 cobalt-nickel-chromium-tungsten alloy, the inner tube tip portion 266 may be formed of HAYNES 188 cobalt-nickel-chromium-tungsten alloy, and the water cooling coil 286 may be formed of INCONEL 625 nickel-chromium alloy. These different parts generally may be forged, machined, and then welded together as described herein above.

As for the feed injector 200, dominant deterioration factors include abrasive wear of the intermediate tube tip portion 264, and heavy corrosion/oxidation and thermal fatigue cracking of the outer tube tip portion 262. The coating of the present technology may be applied to an outer surface of the outer tube tip portion 262, as well as surfaces of other components similarly subjected to a gasification environment, in order to protect the outer tube tip portion 262 and other components from corrosion/oxidation and thermal fatigue cracking. The coating includes chromium in the alpha phase at an operating temperature of the gasification.

Figure 4:
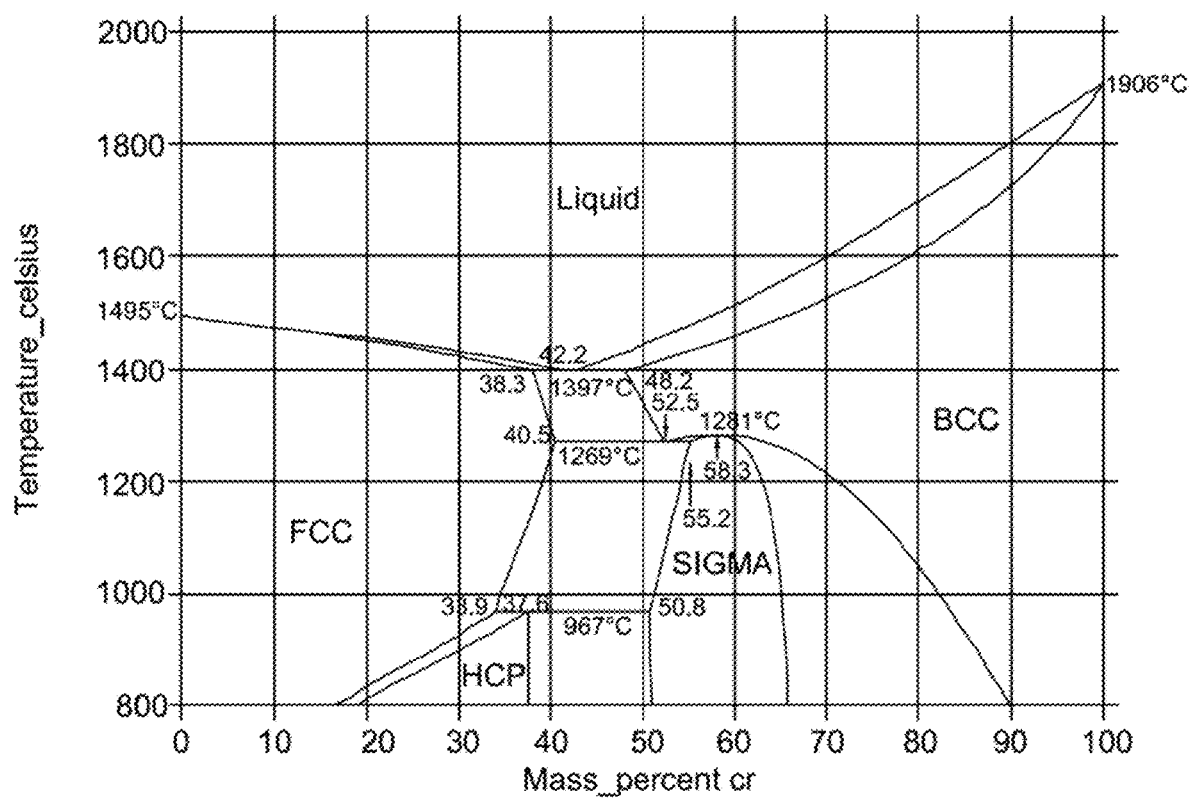
FIG. 4 shows a phase diagram of a Co—Cr alloy.

Referring to FIG. 4, a Co—Cr phase diagram shows that at temperatures from about 1200° C. (approximately 2200° F.) to about 1800° C. (approximately 3270° F.), the alpha phase of chromium exists from about 70-100 weight percent (wt %). In order to obtain an alpha phase chromium coating applied to a cobalt based superalloy gasification component, e.g. an outer tube tip portion of a feed inject, at operating temperatures of the component from about 1200° C. to about 1800° C., the wt % of the chromium in the coating should be at least 70%. However, if the operating temperature of the gasification is controlled at a narrower range, for example, from about 1300° C. to about 1400° C., the alpha phase of chromium exists from about 51-100 wt %, and therefore the wt % of the chromium in the coating should be at least 51%.

Similarly, as can be known from a Ni—Cr phase diagram (not shown), the alpha phase of chromium exists from about 78-100 wt % at temperatures from about 1200° C. to about 1800° C. In order to obtain an alpha phase chromium coating applied to a nickel based superalloy gasification component, at operating temperatures of the component from about 1200° C. to about 1800° C., the wt % of the chromium in the coating should be at least 78%.

In some embodiments, the coating may include at least about 51 wt %, or preferably at least about 70 wt %, or more preferably at least about 75 wt %, or more preferably at least about 80 wt % of chromium in the alpha phase at an operating temperature of the gasification. Given the similar atomic masses of Cr, Co and Ni, the weight percentages of chromium may be approximately the same with respective atomic percentages of chromium. In some embodiments, the operating temperature of the gasification is in a range from about 1200° C. to about 1800° C. In some particular embodiments, the operating temperature of the gasification is in a range from about 1300° C. to about 1400° C. In some embodiments, the coating is at least about 45 μm thick. In some particular embodiments, an overall thickness of the coating is in a range from about 50 μm to about 60 μm.

In some embodiments, the coating may further include other metals such as aluminum for providing uniformity and enhance diffusion of the coating. In some embodiments, the coating may further include other metals such as Co, Fe, Ti, Ta, W, Re, Mo, Hf, Si, and Pt, for providing enhanced oxidation resistance, phase stability, environmental resistance, and/or sulfidation resistance. The coating may also contain various other elements and other materials at impurity levels, e.g., less than about 1% by weight.

The coating may be obtained with a slurry composition including chromium-based powder by an applicable process. In some embodiments, the composition of the chromium-based powder and its amount in the slurry composition may depend on the amount of chromium desired for the coating on the gasification component. In general, suitable amounts of chromium and optionally aluminum in the slurry composition should exceed their respective amounts in the substrate to be protected. The chromium content of the slurry composition should be sufficient to compensate for any projected loss of chromium from the gasification component under expected operating conditions, such as temperatures, temperature/time schedules and cycles, and environmental conditions.

As mentioned above, in some embodiments, the wt % of the chromium in the coating should be at least 51% at operating temperatures of the gasification component, and thus the chromium-based powder of the slurry composition may include about 51-100% by weight of Cr. Similarly, in some embodiments, the wt % of the chromium in the coating should be at least 70%, 78% or 80% at operating temperatures of the gasification component, and thus the chromium-based powder of the slurry composition may respectively include about 70-100%, 78-100% or 80-100% by weight of Cr. The slurry composition may include Cr powder in the Cr(0) oxidation state, i.e. hexavalent free, and is therefore not restricted as is Cr(VI), i.e. hexavalent chromium. The slurry powder particle size distribution may be from about 1 to 5 μm.

Similar to the composition of the coating, the metallic powder of the slurry composition may include aluminum to provide uniformity and enhance diffusion of the coating. The Al powder particle size distribution may be from about 10-14 μm and may be up to about 10%, for example about 1-5%, by weight of the metallic powder. Other metals such as Co, Fe, Ti, Ta, W, Re, Mo, Hf, Si, and Pt may be included to provide enhanced oxidation resistance, phase stability, environmental resistance, and/or sulfidation resistance. The powder may also contain various other elements and other materials at impurity levels, e.g., less than about 1% by weight.

The metallic powder may constitute, by weight, about 25% to about 80%, more preferably about 30% to about 50%, of the entire slurry composition. The powder particles may be in the form of spherical particles, though other forms are possible as well, such as wire, wire mesh, rod, plate, flake, and fibrous. In addition, the powder particles may be hollow or porous. The metallic powder can be used in a variety of standard sizes. Acceptable sizes for the powder particles will depend on several factors, such as the alloy of the gasification component, the technique by which the slurry is to be applied to the gasification component, and the presence and amounts of other potential constituents in the slurry.

The slurry compositions may include a binder, for example, a non-organic binder. One binder that may be used is colloidal silica. The term "colloidal silica" is meant to embrace any dispersion of fine particles of silica in a medium of water or another solvent, with water being preferred such that the slurry composition is a water-based (aqueous) system. Dispersions of colloidal silica are available from various chemical manufacturers in either acidic or basic form. Moreover, various shapes of silica particles can be used, e.g., spherical, hollow, porous, rod, plate, flake, or fibrous, as well as amorphous silica powder. The particles may have an average particle size in a range of about 10 nanometers to about 100 nanometers. Commercial examples of colloidal silica are available under the names Ludox® from Sigma-Aldrich Co. LLC and Remasol® from REMET Corporation, of Utica, N.Y., USA.

The amount of colloidal silica present in the composition will depend on various factors, for example, the amount of metallic powder used and the presence (and amount) of any other constituents in the slurry, for example, an organic stabilizer as discussed below. Colloidal silica appears to function primarily as a very effective binder in the slurry composition. Processing conditions are also a consideration, for example, how the slurry is formed and applied to the gasification component. The colloidal silica may be present at a level in the range of about 1% to about 25% by weight, based on silica solids as a percentage of the entire composition. In especially preferred embodiments, the amount is in the range of about 10% to about 20% by weight.

In addition to the metallic powder and colloidal silica, the slurry compositions may further include other constituents, for example wetting agents and metal powder stabilizers. One example of a wetting agent and stabilizer is glycerol, $C_3H_5(OH)_3$, sometimes referred to as "glycerin" or "glycerine." Glycerol can readily be obtained from fats, i.e., glycerides. It is believed that glycerol is especially effective at passivating aluminum within the slurry.

Suitable amounts for the stabilizer in the slurry composition are believed to be in a range of about 0.1% by weight to about 20% by weight, for example about 0.5% to about 15% by weight, based on the total weight of the slurry composition. The amount of stabilizer will depend on various factors including the specific type of stabilizer used, its water-miscibility, the effect of the stabilizer on the viscosity of the slurry composition, the amount of metallic powder in the slurry composition, the particle sizes of the metallic powder, the surface-to-volume ratio of the powder particles, the specific technique used to prepare the slurry, and the presence of any other components in the slurry composition. For example, if used in sufficient quantities, the stabilizer might be capable of preventing or minimizing any undesirable reaction between the metallic powder and any phosphoric acid present in the slurry. The organic stabilizer may be present in an amount sufficient to chemically stabilize the metallic powder during contact with water or any other aqueous components of the slurry, meaning that slurry remains substantially free of undesirable chemical reactions, including those that would increase the viscosity and/or temperature of the composition to unacceptable levels. For example, unacceptable increases in temperature or viscosity are those which could prevent the slurry composition from being easily applied to the gasification component, e.g., by spraying. As a very general guideline, compositions deemed to be unstable are those that exhibit (e.g., after a short induction period) a temperature increase of greater than about 10° C. within about one minute, or greater than about 30° C. within about ten minutes. In the alternative (or in conjunction with a temperature increase), these compositions may also exhibit unacceptable increases in viscosity over a similar time period.

The slurry compositions may also contain various other ingredients as well, including compounds known to those involved in slurry preparations. Examples include thickening agents, dispersants, deflocculants, anti-settling agents, anti-foaming agents, plasticizers, emollients, surfactants, and lubricants. In general, such additives may be used at a level in the range of about 0.01% by weight to about 10% by weight, based on the weight of the entire slurry composition.

As mentioned above, the slurry composition may be aqueous. In other words, it includes a liquid carrier (e.g., the medium in which the colloidal silica is employed) that is primarily or entirely water. As used herein, "aqueous" refers to slurry compositions in which at least about 65% and preferably at least about 80% of the volatile components are water. Thus, a limited amount of other liquids may be used in admixture with the water. Examples of the other liquids or "carriers" include alcohols, for example, lower alcohols with 1-4 carbon atoms in the main chain, such as ethanol. Halogenated hydrocarbon solvents are another example. Selection of a particular carrier composition will depend on various factors, such as the evaporation rate required during treatment of the gasification component with the slurry, the effect of the carrier on the adhesion of the slurry to the gasification component, the solubility of additives and other components in the carrier, the "dispersability" of powders in the carrier, the carrier's ability to wet the gasification component and modify the rheology of the slurry composition, as well as handling requirements, cost requirements, and environmental/safety concerns.

A suitable amount of liquid carrier employed is usually the minimum amount sufficient to keep the solid components of the slurry in suspension. Amounts greater than that level may be used to adjust the viscosity of the slurry composition, depending on the technique used to apply the composition. In general, the liquid carrier will typically constitute about 10% by weight to about 30% by weight, for example about 20% by weight, of the entire slurry composition. It should be noted that the slurry is termed a solid-in-liquid emulsion.

The use of this slurry composition is especially advantageous for forming the protective coating on the gasification component formed of superalloy materials, though its application to other metal substrates is also within the scope of the invention. The term "superalloy" is usually intended to embrace complex cobalt, nickel, and iron-based alloys that include one or more other elements, such as chromium, rhenium, aluminum, tungsten, molybdenum, titanium, etc. Superalloys are described in many references, including U.S. Pat. No. 5,399,313, which is incorporated herein by reference.

The slurry may be applied to a target surface of the gasification component by a variety of deposition techniques known in the art. Some examples of the deposition techniques include slip-casting, brush-painting, dipping, spraying, pouring, rolling, or spin-coating. Spray-coating is one way to apply the slurry to the gasification component. The viscosity of the coating can be readily adjusted for spraying by varying the amount of liquid carrier used.

The slurry can be applied as one layer or multiple layers. Multiple layers may sometimes be required to deliver the desired amount of chromium metal to the gasification component. If a series of layers is used, a heat treatment may be performed after each layer is deposited to accelerate removal of the volatile components. After the full thickness of the slurry has been applied, the slurry coating may be allowed to "air dry" before further processing to form the final coating. Alternatively and/or additionally, a heat treatment may be carried out to further remove volatile materials, such as the organic solvents and water. An exemplary heating regimen is about five minutes to about two hours at a temperature in the range of about 80° C. to about 200° C. (about 176° F. to about 392° F.). Longer heating times can compensate for lower heating temperatures, and vice versa.

The uniformly applied slurry coating may also be "cured" to provide a green coating. For example, the component or article with the applied slurry coating may be heated to about 150° C. for one hour. Such treatment may be sufficient to remove volatiles, e.g. water and glycerol, from the slurry coating.

The green coating may then be heated to a temperature sufficient to sinter the slurry coating and diffuse the chromium (and, if present, aluminum and/or other metallic species) into the near-surface regions of the gasification component and to sinter the green coating into a final coating. As used herein, a "near-surface region" extends to a depth of up to about 200 µm into the surface of the gasification component, typically a depth of about 75 µm and preferably at least 25 µm into the surface, and includes both a chromium-enriched region closest to the surface and an area of interdiffusion immediately below the enriched region. Therefore the metal-based substrate of the gasification component formed with the final coating may have such a near-surface region below the final coating.

Temperatures required for this chromizing step (i.e., the diffusion temperature) will depend on various factors, including the composition of the gasification component, the specific composition and thickness of the slurry, the desired depth of enhanced chromium concentration and a thickness of the final coating. Usually the diffusion temperature is within the range of about 650° C. to about 1100° C. (about 1200° F. to about 2010° F.), for example about 800° C. to about 950° C. (about 1472° F. to about 1742° F.). These temperatures are also high enough to completely remove (by vaporization or pyrolysis) any organic compounds present, including stabilizers such as glycerol. The diffusion heat treatment can be carried out by any convenient technique, including heating in a vacuum or inert gas within an oven.

The time required for the diffusion heat treatment will depend on the factors described above. Generally, the time will range from about thirty minutes to about eight hours. In some instances, a graduated heat treatment is desirable. As a very general example, the temperature could be raised to about 650° C., held there for a period of time, and then increased in steps to about 850° C. Alternatively, the temperature could initially be raised to a threshold temperature such as 650° C. and then raised continuously, e.g., about 1° C. per minute, to reach a temperature of about 850° C. in about 200 minutes.

Alternatively, the green coating may be subjected to a pack CVD vapor phase chromium process (sometimes also referred to as Cr pack cementation process) to form the final coating. Process parameters of temperature, gas flow rate, and chromium chloride concentration may be selected to control the deposition rate. The transformation of the green coating to the final coating by the pack CVD process allows for the use of less aluminum and provides a reduction in the porosity of the final coating. A thicker coating, for example a coating having a thickness of up to about 1.75 mil (about 45 µm), may be produced by the pack CVD process. The pack CVD process is also less sensitive to the slurry powder particle size distribution because of the reduced porosity of the coating. The coating also has a metallurgical bond with the substrate of the component or article because it is a diffusion bond. The coating also provides an alpha chromium structure which is highly corrosion resistant.

EXAMPLE

In this example, a chromium (Cr) coating was coated on an outer tube tip portion (outer tip) of a feed injector for use in a gasification system, which is similar to the outer tube tip portion 262 as shown in FIG. 3.

A slurry including about 60% by weight of Cr powder, about 32% by weight of colloidal silica (consisting of about 23% by weight of silica and about 77% by weight of water) as a binder, and about 8% by weight of glycerol (also called glycerine) as a wetting agent and stabilizer, was applied to an outer surface of the outer tip to form a slurry coating having a thickness of about 25 µm. The outer tip applied with the slurry coating was heated to about 150° C. for one hour to cure the slurry coating and remove volatiles, e.g. water and glycerol from the slurry coating. Thereby a green coating was formed on the outer surface of the outer tip. The outer tip with the green coating was subjected to a Cr pack cementation process in hydrogen ($H_2$) atmosphere at a temperature in a range from about 1050° C. to about 1150° C. (about 1900° F. to about 2100° F.). In the Cr pack cementation process, the cooling water inlet and outlet on the outer tip were masked by a masking material. In this way, a coating including chromium in the alpha phase was formed on the outer surface of the outer tip.

Then the coated outer tip was coupled with associated components and equipment like intermediate and inner tube tip portions and water cooling coils, and used in a gasification system.

Figure 5B:
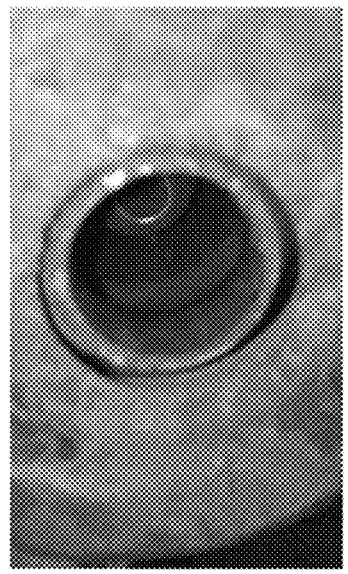
FIG. 5B shows an outer surface of a coated injector outer tip which has serviced for 37 days.
Figure 5A:
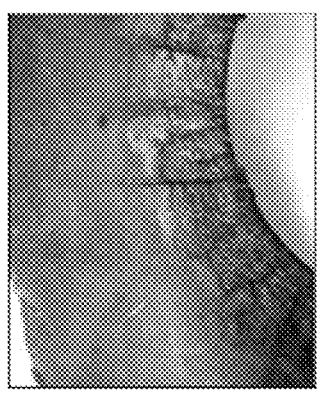
FIG. 5A shows a part of an outer surface of an uncoated injector outer tip which has serviced for 15 days.

FIG. 5A shows an outer surface of an uncoated injector outer tip which has been in service for 15 days. FIG. 5B shows the outer surface of the coated injector outer tip which has been in service for 37 days. As can be seen from FIGS. 5A and 5B, heavy corrosion, radial and circumferential cracks were found on the outer surface of the uncoated injector outer tip, whereas there is no severe corrosion or cracks on the outer surface of the coated injector outer tip. The coated feed injector outer tip can still be used in the field after 37 days.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A gasification component for use in a gasification environment, the component comprising:
    a metal-based substrate; and
    a coating deposited on an outer surface of the metal-based substrate, the coating having a thickness of at least 45 micrometers ($\mu$m) on the outer surface of the metal-based substrate, the coating having at least about 51% by weight chromium at the alpha phase while the coating is exposed to an operating temperature of gasification, the operating temperature of gasification being between 1200° C. and 1800° C.; and
    the coating deposited on the outer surface of the metal-based substrate by: (a) applying a slurry comprising at least about 51% by weight of chromium powder in the Cr(0) oxidation state to the surface to form a slurry coating on the surface, (b) curing the slurry coating to form a green coating, and (c) sintering the green coating, such that chromium of the coating is diffused into the metal-based substrate from the outer surface to at least a depth within the metal-based substrate to form a chromium-enriched region that extends from the outer surface of the metal-based substrate that the coating covers to the depth within the metal-based substrate and an area of interdiffusion within the metal-based substrate that is defined such that the chromium-enriched region is between the outer surface of the metal-based substrate and the area of interdiffusion, the depth being at least 25 $\mu$m within the metal-based substrate to no more than 200 $\mu$m within the metal-based substrate;
wherein the slurry composition comprises from about 10% to about 30% by weight of a liquid carrier.

2. The gasification component according to claim 1, wherein the metal-based substrate comprises a nickel-based alloy, a cobalt-based alloy or a combination thereof.

3. The gasification component according to claim 1, wherein:
    the coating has a thickness of 50 $\mu$m to 60 $\mu$m and the depth is at least 25 $\mu$m within the metal-based substrate to 75 $\mu$m within the metal-based substrate.

4. The gasification component according to claim 1, wherein the coating comprises at least about 70% by weight of chromium in the alpha phase at the operating temperature of gasification.

5. The gasification component according to claim 1, wherein the operating temperature of gasification is in a range from about 1300° C. to about 1400° C.

6. The gasification component according to claim 1, wherein the coating further comprises aluminum.

7. The gasification component according to claim 1, wherein the gasification component is an outer tube tip portion of a feed injector attachable to a gasifier such that the outer tube tip portion is positioned within the gasifier, the feed injector also having an inner tube tip portion and an intermediate tube tip portion between the inner tube tip portion and the outer tube tip portion, the inner tube tip portion and the intermediate tube tip portion being positionable within the gasifier, the feed injector also having a mounting flange for attaching the feed injector to the gasifier to position the outer tube tip portion, intermediate tube tip portion, and the inner tube tip portion within the gasifier.

8. The gasification component according to claim 1, wherein the gasification component comprises a feed injector of a gasification system.

9. The gasification component of claim 1, wherein the gasification component is an outer tube tip portion of a feed injector of a gasification system.

10. The gasification component of claim 9, wherein the outer tube tip portion of the feed injector is positioned within a gasifier.

11. The gasification component of claim 3, wherein the gasification component is an outer tube tip portion of a feed injector positionable in a gasifier of a gasification system.

12. The gasification component according to claim 1, wherein the gasification component is an outer tube tip portion of a feed injector attachable to a gasifier such that the outer tube tip portion is positioned within the gasifier, the feed injector also having an inner tube tip portion and an intermediate tube tip portion between the inner tube tip portion and the outer tube tip portion, the inner tube tip portion and the intermediate tube tip portion being positionable within the gasifier, the feed injector also having a mounting flange for attaching the feed injector to the gasifier to position the outer tube tip portion, intermediate tube tip portion, and the inner tube tip portion within the gasifier; and
    wherein the feed injector also includes a water cooling system configured to circulate a flow of cooling water to cool the outer tube tip portion.

13. The gasification component according to claim 12, wherein an outer feed passage passes through the outer tube tip portion to feed air and/or steam to the gasifier, an intermediate feed passage passes through the intermediate tube tip portion to feed fuel and/or steam into the gasifier, and an inner feed passage passes through the inner tube tip portion to feed air and/or steam into the gasifier.

* * * * *